United States Patent
Yaung et al.

(10) Patent No.: US 6,803,250 B1
(45) Date of Patent: Oct. 12, 2004

(54) IMAGE SENSOR WITH COMPLEMENTARY CONCAVE AND CONVEX LENS LAYERS AND METHOD FOR FABRICATION THEREOF

(75) Inventors: Dun-Nian Yaung, Taipei (TW); Sou-Kuo Wu, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/423,375

(22) Filed: Apr. 24, 2003

(51) Int. Cl.[7] ............................................. H01L 21/00
(52) U.S. Cl. .......................................... 438/70; 438/71
(58) Field of Search ............................. 438/69, 70, 71, 438/72

(56) References Cited

U.S. PATENT DOCUMENTS

| | | | | |
|---|---|---|---|---|
| 5,283,675 A | | 2/1994 | Ooi et al. ...................... 349/86 |
| 5,371,397 A | * | 12/1994 | Maegawa et al. ............ 257/432 |
| 5,593,913 A | * | 1/1997 | Aoki ............................. 438/71 |
| 6,100,953 A | | 8/2000 | Kim et al. .................... 349/129 |
| 6,188,094 B1 | * | 2/2001 | Kochi et al. ................. 257/232 |
| 6,255,640 B1 | | 7/2001 | Endo et al. .................... 438/70 |
| 6,288,388 B1 | * | 9/2001 | Zhang et al. ................ 257/222 |

* cited by examiner

Primary Examiner—Chandra Chaudhari
(74) Attorney, Agent, or Firm—Tung & Associates

(57) ABSTRACT

A method for forming an optoelectronic product provides for forming a concave lensing layer registered with a photoactive region within a substrate. The concave lensing layer is formed employing an isotropic etching method. Registered in turn with a concavity with the concave lensing layer is a convex microlens layer formed over the concave lensing layer. The combination of the foregoing lensing layers provides the optoelectronic product with enhanced optical performance.

12 Claims, 1 Drawing Sheet

IMAGE SENSOR WITH COMPLEMENTARY CONCAVE AND CONVEX LENS LAYERS AND METHOD FOR FABRICATION THEREOF

BACKGROUND OF THE INVENTION

1. Field of the Invention

The present invention relates generally to optoelectronic microelectronic products. More particularly, the present invention relates to image sensor optoelectronic microelectronic products.

2. Description of the Related Art

Within the general art of microelectronic product fabrication there exist purely electronic microelectronic products whose operation is based solely upon electrical signal storage and processing characteristics of purely electronic microelectronic devices and microelectronic circuits formed upon a microelectronic substrate. Examples of such purely electronic microelectronic products typically include, but are not limited to, semiconductor products and ceramic substrate products. Similarly, there also exist within the general art of microelectronic product fabrication microelectronic products whose operation is based upon a codependent transduction, storage and/or processing of optical and electrical signals while employing optoelectronic microelectronic devices formed upon a microelectronic substrate. Examples of such optoelectronic microelectronic products typically include, but are not limited to: (1) solar cell products; and (2) image array products such as but not limited to: (a) sensor image array products; and (b) display image array products.

While optoelectronic products are thus quite common in the microelectronic fabrication art, optoelectronic products are nonetheless not entirely without problems.

In that regard, it is often difficult to fabricate optoelectronic products with enhanced optical performance.

It is towards the foregoing object that the present invention is directed.

Various optoelectronic products having desirable properties, and methods for fabrication thereof, have been disclosed in the microelectronic product fabrication art.

Included among the optoelectronic products but not limiting among the optoelectronic products are optoelectronic products disclosed within: (1) Ooi et al., in U.S. Pat. No. 5,283,675 (a liquid crystal display optoelectronic product with an electrode having a concave and convex undulating surface); (2) Kim et al., in U.S. Pat. No. 6,100,953 (a liquid crystal display optoelectronic product with a color filter layer having a concave surface); and (3) Endo et al., in U.S. Pat. No. 6,255,640 (an image sensor optoelectronic product with a color filter layer having a protuberance).

The teachings of each of the foregoing references are incorporated herein fully by reference.

Desirable are additional optoelectronic products with enhanced optical performance.

It is towards the foregoing object that the present invention is directed.

SUMMARY OF THE INVENTION

A first object of the invention is to provide a method for forming an optoelectronic product.

A second object of the invention is to provide a method in accord with the first object of the invention, wherein the optoelectronic product is formed with enhanced optical performance.

In accord with the objects of the invention, the invention provides a method for forming an optoelectronic product.

To practice the method of the invention, there is first provided a substrate having formed therein a photoactive region. There is then formed over the substrate including the photoactive region a planarizing passivation layer. There is then masked the planarizing passivation layer to form a masked planarizing passivation layer which leaves exposed a portion thereof registered with the photoactive region. There is then etched isotropically the masked planarizing passivation layer to form an isotropically etched planarizing passivation layer having formed therein a concavity registered with the photoactive region. Finally, there is then formed over the isotropically etched planarizing passivation layer and registered with the concavity a microlens layer having a convex surface.

The method of the invention contemplates in part a microelectronic product which may be formed in accord with the method of the invention.

The present invention provides a method for forming an optoelectronic product, wherein the optoelectronic product is formed with enhanced optical performance.

The invention realizes the forgoing object by forming registered with a photoactive region within a substrate a concavity within a planarizing passivation layer formed over the substrate. The concavity is formed incident to isotropic etching of the planarizing passivation layer when properly masked. In turn, a microlens layer having a convex surface is formed over and registered with the concavity. Thus, the invention provides an optoelectronic product having a concave lensing layer registered with a convex lensing layer to provide the optoelectronic product with enhanced optical performance.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming an optoelectronic product, wherein the optoelectronic product is formed with enhanced optical performance.

The invention realizes the forgoing object by forming registered with a photoactive region within a substrate a concavity within a planarizing passivation layer formed over the substrate. The concavity is formed incident to isotropic etching of the planarizing passivation layer when properly masked. In turn, a microlens layer having a convex surface is formed over and registered with the concavity. Thus, the invention provides an optoelectronic product having a concave lensing layer registered with a convex lensing layer to provide the optoelectronic product with enhanced optical performance.

While the preferred embodiment of the invention illustrates the invention most particularly within the context of a color filter sensor image array optoelectronic product, the invention is not intended to be so limited. Rather the invention may be employed for providing enhanced optical performance within optoelectronic products including but not limited to sensor image array and non-array optoelectronic products including but not limited to color filter products and non-color filter products.

FIG. 1 to FIG. 4 show a series of schematic cross-sectional diagram illustrating the results of progressive stages of forming an optoelectronic product in accord with a preferred embodiment of the invention.

Figure 1:
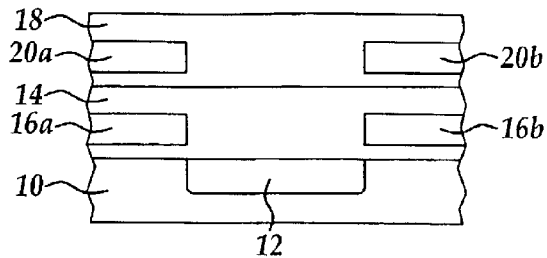
FIG. 1, FIG. 2, FIG. 3 and FIG. 4 show a series of schematic cross-sectional diagrams illustrating the results of progressive stages of fabricating an image sensor optoelectronic product in accord with the preferred embodiment of the invention.

FIG. 1 shows a substrate 10 having formed therein a photoactive region 12.

Within the invention, the substrate 10 is typically a semiconductor substrate and the photoactive region 12 is typically a photodiode photoactive region formed within the semiconductor substrate. The present invention does not, however, limit the substrate 10 to a semiconductor substrate and the photoactive region 12 to a photodiode photoactive region. As is understood by a person skilled in the art, although FIG. 1 illustrates the substrate 10 as having formed therein a single photoactive region 12, the invention intends the substrate 10 to have formed therein a plan view bidirectional array of photoactive regions.

FIG. 1 also shows formed over the substrate 10: (1) a first planarizing passivation layer 14 having formed therein a pair of patterned first conductor layers 16a and 16b, in turn having formed thereupon; (2) a second planarizing passivation layer 18 having formed therein a pair of patterned second conductor layers 20a and 20b.

Within the invention, each of the first planarizing passivation layer 14 and the second planarizing passivation layer 18 is formed of a dielectric material transparent to a dose of incident radiation whose detection and quantification is intended to be effected by the optoelectronic product of FIG. 1. Typically, each of the first planarizing passivation layer 14 and the second planarizing passivation layer 18 is formed as a laminate of a single dielectric material, such as in particular a silicon oxide dielectric material, a silicon nitride dielectric material or a silicon oxynitride dielectric material, such as not to effect undesirable reflective losses for the dose of incident radiation. Typically, each of the first planarizing passivation layer 14 and the second planarizing passivation layer 18 is formed to a thickness of from about 10000 to about 20000 angstroms and each of the first planarizing passivation layer 14 and the second planarizing passivation layer 18 has a planar surface.

Within the invention, each of the pair of patterned first conductor layers 16a and 16b and the pair of patterned second conductor layers 20a and 20b generally serves charge collection and routing purposes in the optoelectronic product of FIG. 1. In addition, each of the pair of patterned first conductor layers 16a and 16b and the pair of patterned second conductor layers 20a and 20b may be formed of conductor materials as are conventional in the art of microelectronic fabrication, including in particular aluminum containing conductor materials and copper containing conductor materials. Typically, each of the pair of patterned first conductor layers 16a and 16b and the pair of patterned second conductor layers 20a and 20b is formed to a thickness of from about 4000 to about 8000 angstroms.

Figure 2:
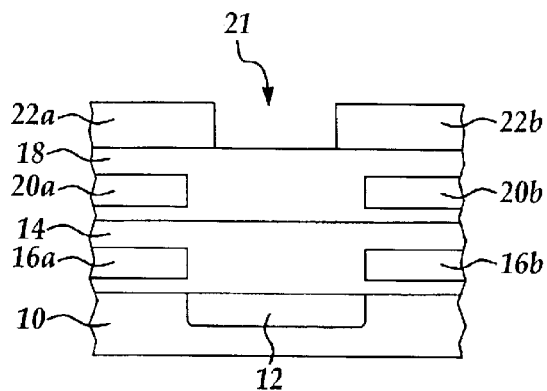

FIG. 2 shows the results of further processing of the optoelectronic product of FIG. 1.

FIG. 2 shows the results of forming upon the second planarizing passivation layer 18 a pair of patterned mask layers 22a and 22b which define an aperture 21 which is registered with the photoactive region 12.

Within the invention, pair of patterned mask layers 22a and 22b may be formed of mask materials as are conventional in the art of microelectronic fabrication, including but not limited to photoresist mask materials and hard mask materials. Typically, the pair of patterned mask layers 22a and 22b is formed of a silicon oxide hard mask material under circumstances where the second planarizing passivation layer 18 is formed of a silicon nitride or silicon oxynitride planarizing passivation material. Typically, the pair of patterned mask layers 22a and 22b is formed to a thickness of from about 2000 to about 8000 angstroms and may be formed employing the same photomask as is employed for forming the photoactive region 12. Typically, in plan view the aperture 21 may define any of several regular or irregular shapes, but the aperture 21 typically in plan view defines a circular or square shape.

Figure 3:
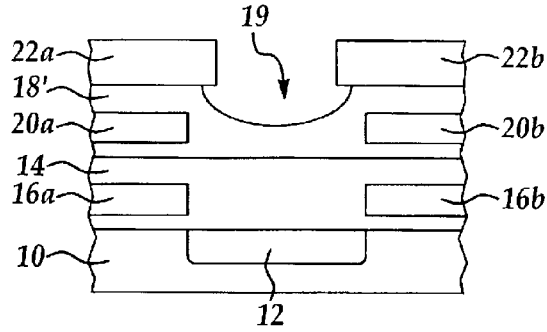

FIG. 3 shows the results of further processing of the optoelectronic product of FIG. 2.

FIG. 3 shows the results of isotropically etching the second planarizing passivation layer 18 to form therefrom an isotropically etched second planarizing passivation layer 18'. The isotropically etched second planarizing passivation layer 18' has formed therein a concavity 19 registered with the photoactive region 12.

Within the invention when the second planarizing passivation layer 18 is formed of a silicon nitride material or silicon oxynitride material and the pair of patterned mask layers 22a and 22b is formed of a silicon oxide material, the second planarizing passivation layer 18 may be isotropically etched to form the isotropically etched second planarizing passivation layer 18' through etching with an aqueous phosphoric acid etchant at elevated temperature.

Within the invention, the concavity 19 typically has a linewidth of from about 1 to about 3 microns and a depth of from about 3000 to about 12000 angstroms within the isotropically etched second planarizing passivation layer 18'.

Figure 4:
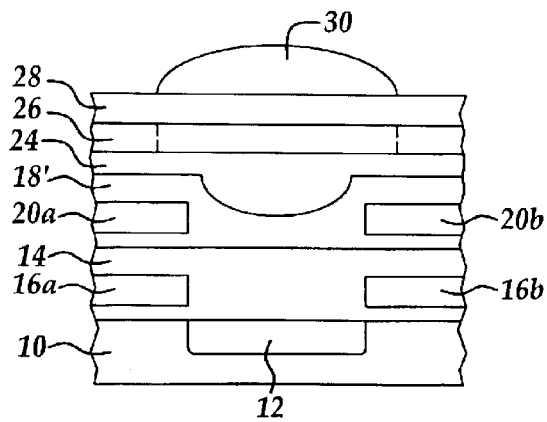

FIG. 4 shows the results of further processing of the optoelectronic product of FIG. 3.

FIG. 4 first shows the results of stripping the pair of patterned mask layers 22a and 22b from the isotropically etched second planarizing passivation layer 18'. The pair of patterned mask layers 22a and 22b may be stripped employing methods as are conventional in the art of microelectronic fabrication.

FIG. 4 also shows formed upon the isotropically etched second planarizing passivation layer 18' a series of layers comprising: (1) a planarizing first spacer layer 24 formed upon the isotropically etched second planarizing passivation layer 18' and filling the concavity 19; (2) a color filter layer 26 formed upon the planarizing first spacer layer 24; (3) a second spacer layer 28 formed upon the color filter layer 26; and (4) a microlens layer 30 formed upon the second spacer layer 28.

Within the invention, each of the foregoing layers may be formed employing methods and materials as are conventional in the optoelectronic microelectronic product fabrication art.

For example, each of the planarizing first spacer layer 24 and the second spacer layer 28 may be formed of a planarizing material, such as a negative photoresist planarizing material which may be photoexposed to provide a thermally stable planarizing material. Within the invention, the use of the pair of spacer layers comprising the planarizing first spacer layer 24 and the second spacer layer 28 when each is formed as a blanket layer (i.e., completely covering underlying layers, as illustrated in FIG. 4) of a planarizing material is of particular significance insofar as such a laminated construction provides for optimized planarizing and related spacing of the convex microlens layer 30 from the concave lens portion defined within the isotropically etched second planarizing passivation layer 18'. Such is also important when the color filter layer 26 is formed of a mosaic of patterned adjacent or adjoining sub-layers which do not in themselves provide a planarized color filter layer.

In general, the color filter layer 26 may also be formed of a photo initiated thermally stabilized photoresist material, but having incorporated therein appropriate dye materials for effective detection and quantification of incident radiation.

Finally, the microlens layer 30 may also be formed of a photoresist material, such as a positive photoresist material having a lower glass transition temperature such that the microlens layer 30 may be formed effectively incident to thermal annealing while the remaining layers formed thereunder remain dimensionally stable. Typically, the microlens layer 30 is formed of a linewidth from about 2.5 to about 6 microns and a thickness of from about 5000 to about 20000 angstroms, registered with the concavity and the photoactive region 12.

FIG. 4 illustrates an optoelectronic product formed in accord with the preferred embodiment of the invention. The optoelectronic product is formed with enhanced optical properties insofar as the optoelectronic product is formed with: (1) a concave lensing layer formed over and registered with a photoactive region formed within a substrate; and (2) a convex lensing layer formed over and registered with a concavity within the convex lensing layer.

The preferred embodiment of the invention is illustrative of the invention rather than limiting of the invention. Revisions and modifications may be made to methods, materials, structures and dimensions in accord with the preferred embodiment of the invention while still providing an optoelectronic product in accord with the invention, further in accord with the accompanying claims.

What is claimed is:

1. A method for forming an optoelectronic product comprising:

providing a substrate having formed therein a photoactive region;

forming over the substrate including the photoactive region a planarizing passivation layer formed of a silicon oxide material;

masking the planarizing passivation layer to form a masked planarizing passivation layer which leaves exposed a portion thereof registered with the photoactive region;

etching isotropically the masked planarizing passivation layer to form an isotropically etched planarizing passivation layer having formed therein a concavity registered with the photoactive region; and forming over the isotropically etched planarizing passivation layer and registered with the concavity a microlens layer having a convex surface.

2. The method of claim 1 wherein the planarizing passivation layer is formed to a thickness of from about 10000 to about 20000 angstroms.

3. The method of claim 1 wherein the concavity is formed to a depth of from about 3000 to about 12000 angstroms.

4. The method of claim 1 wherein the planarizing passivation layer is masked employing a photomask which is also employed for forming the photoactive region.

5. A method for forming an optoelectronic product comprising:

providing a substrate having formed therein a photoactive region;

forming over the substrate including the photoactive region a planarizing passivation layer;

masking the planarizing passivation layer to form a masked planarizing passivation layer which leaves exposed a portion thereof registered with the photoactive region;

etching isotropically the masked planarizing passivation layer to form an isotropically etched planarizing passivation layer having formed therein a concavity registered with the photoactive region;

forming over the isotropically etched planarizing passivation layer a color filter layer; and forming over the color filter layer and registered with the concavity a microlens layer having a convex surface.

6. The method of claim 5 wherein the planarizing passivation layer is formed from a silicon oxide material.

7. The method of claim 5 wherein the planarizing passivation layer is formed from a silicon nitride material.

8. The method of claim 5 wherein the planarizing passivation layer is formed to a thickness of from about 10000 to about 20000 angstroms.

9. The method of claim 5 wherein the concavity is formed to a depth of from about 3000 to about 12000 angstroms.

10. The method of claim 5 wherein the planarizing passivation layer is masked employing a photomask which is also employed for forming the photoactive region.

11. The method of claim 5 further comprising forming interposed between the isotropically etched planarizing passivation layer and the color filter layer a first planarizing spacer layer.

12. A method for forming an optoelectronic product comprising:

providing a substrate having formed therein a photoactive region;

forming over the substrate including the photoactive region a planarizing passivation layer;

masking the planarizing passivation layer to form a masked planarizing passivation layer which leaves exposed a portion thereof registered with the photoactive region;

etching isotropically the masked planarizing passivation layer to form an isotropically etched planarizing passivation layer having formed therein a concavity registered with the photoactive region;

forming over the isotropically etched planarizing passivation layer a color filter layer; and forming over the color filter layer a second planarizing spacer layer;

forming over the second planarizing spacer layer and registered with the concavity a microlens layer having a convex surface.

* * * * *